United States Patent
Jang et al.

(10) Patent No.: US 11,189,810 B2
(45) Date of Patent: Nov. 30, 2021

(54) QUANTUM-DOT LIGHT EMITTING DEVICE COMPRISING SOLUTION PROCESSED CHARGE GENERATION JUNCTION AND MANUFACTURING METHOD THEREOF

(71) Applicant: UNIVERSITY-INDUSTRY COOPERATION GROUP OF KYUNG HEE UNIVERSITY, Yongin-si (KR)

(72) Inventors: Jin Jang, Seoul (KR); Eun Sa Hwang, Seoul (KR); Hyo Min Kim, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 16/336,354

(22) PCT Filed: Aug. 16, 2017

(86) PCT No.: PCT/KR2017/008892
§ 371 (c)(1),
(2) Date: Mar. 25, 2019

(87) PCT Pub. No.: WO2018/056578
PCT Pub. Date: Mar. 29, 2018

(65) Prior Publication Data
US 2019/0214594 A1    Jul. 11, 2019

(30) Foreign Application Priority Data
Sep. 26, 2016 (KR) .................. 10-2016-0123173

(51) Int. Cl.
*H01L 51/50* (2006.01)
*H01L 51/00* (2006.01)
(Continued)

(52) U.S. Cl.
CPC ........ *H01L 51/502* (2013.01); *H01L 51/0003* (2013.01); *H01L 51/5044* (2013.01);
(Continued)

(58) Field of Classification Search
None
See application file for complete search history.

(56) References Cited

U.S. PATENT DOCUMENTS

2018/0062100 A1* 3/2018 Xu .................. H01L 27/3209

FOREIGN PATENT DOCUMENTS

EP          3188272 A1 *  7/2017  ........... H01L 27/322
JP       2001-053329 A     2/2001
(Continued)

OTHER PUBLICATIONS

Korean Office Action for Application No. 10-2016-0123173 dated Nov. 1, 2017.
(Continued)

*Primary Examiner* — Robert K Carpenter
(74) *Attorney, Agent, or Firm* — Sughrue Mion, PLLC

(57) ABSTRACT

Disclosed are a structure of a quantum-dot light emitting device including a charge generation junction layer and a method of fabricating the quantum-dot light emitting device. A quantum-dot light emitting device according to an embodiment of the present invention includes a negative electrode, a first charge generation junction layer including a p-type semiconductor layer and an n-type semiconductor layer, a quantum-dot light emitting layer, a hole transport layer, a second charge generation junction layer including a p-type semiconductor layer and an n-type semiconductor layer, and a positive electrode. The first and second charge generation junction layers is formed using a solution process. Accordingly, charge generation and injection can be stabilized, a process time can be shorted, and problems in the
(Continued)

work function a positive or a negative electrode of a quantum-dot light emitting device can be addressed.

14 Claims, 12 Drawing Sheets

(51) Int. Cl.
    *H01L 51/56*     (2006.01)
    *H01L 51/52*     (2006.01)

(52) U.S. Cl.
    CPC ...... *H01L 51/5056* (2013.01); *H01L 51/5068* (2013.01); *H01L 51/5084* (2013.01); *H01L 51/5088* (2013.01); *H01L 51/5092* (2013.01); *H01L 51/5278* (2013.01); *H01L 51/56* (2013.01); *H01L 51/006* (2013.01); *H01L 51/0035* (2013.01); *H01L 51/0037* (2013.01); *H01L 51/0043* (2013.01); *H01L 51/0058* (2013.01); *H01L 51/0061* (2013.01); *H01L 51/0072* (2013.01); *H01L 2251/303* (2013.01)

(56) References Cited

FOREIGN PATENT DOCUMENTS

| | | |
|---|---|---|
| KR | 10-0540548 B1 | 1/2006 |
| KR | 10-0642431 B1 | 11/2006 |
| KR | 10-2016-0066721 A | 6/2016 |
| KR | 10-2016-0071924 A | 6/2016 |
| KR | 10-2016-0074376 A | 6/2016 |
| WO | WO-2016089131 A1 * | 6/2016   ......... H01L 51/5056 |

OTHER PUBLICATIONS

International Search Report for PCT/KR2017/008892 dated Nov. 23, 2017 [PCT/ISA/210].

* cited by examiner

QUANTUM-DOT LIGHT EMITTING DEVICE COMPRISING SOLUTION PROCESSED CHARGE GENERATION JUNCTION AND MANUFACTURING METHOD THEREOF

RESEARCH PROJECT

The research was supported by the Korea Evaluation Institute of Industrial Technology (KEIT) Development of Core Technologies (Grant Number: 10070201) for Transportation Systems such as Green Car program funded by the Ministry of Trade, Industry and Energy (MOTIE).

CROSS-REFERENCE TO RELATED APPLICATION

This application is a National Stage of International Application No. PCT/KR2017/008892, filed on Aug. 16, 2017, which claims the priority benefit of Korean Patent Application No. 10-2016-0123173, filed on Sep. 26, 2016 in the Korean Intellectual Property Office, the disclosure of which is incorporated herein by reference.

TECHNICAL FIELD

Embodiments of the present invention relate to a quantum-dot light emitting device including a charge generation junction formed by a solution process and a method of fabricating the same.

BACKGROUND ART

A Light Emitting Device (LED), which uses a phenomenon that electrons recombine with holes to emit light when a current flows through a diode made of a gallium nitride (GaN)-based compound semiconductor, has received great attention in the optical device and high-output electronic device development fields.

In recent years, the development of a high-performance, long-life quantum-dot light emitting device and an organic light emitting device has been steadily conducted. To accomplish this, it is very important to inject a charge into a light emitting device, transport the injected charge, and generate an additional charge in the light emitting device.

Accordingly, a charge generation junction layer, which serves to reduce an energy barrier when a charge moves to a next transport layer in a light emitting device, has been additionally used.

However, since it is very difficult to form a small molecular organic P-N junction layer, which is used as a charge generation junction layer, into a liquid phase, the small molecular organic P-N junction layer has been formed only by a vacuum deposition process.

However, such a vacuum deposition process is disadvantageous in that a substrate or a mask may be warped when manufacturing a large-area display and a long tack time (about 1 hour) is required to vaporize small molecules. Therefore, there is a need for an easy method of producing a charge generation junction layer applicable to a large-area process, and being capable of lowering investment costs.

Meanwhile, in the case of a tandem light emitting device fabricated by laminating two or more light emitting devices, a process may become complicated because the numbers of layers included in each of the light emitting units are different. In addition, material costs may increase because materials constituting each of the light emitting units are different. Further, a driving voltage may increase and thus efficiency may be decreased because the number of layers increases.

RELATED ART DOCUMENTS

Patent Documents

Korean Patent No. 10-0540548 entitled "QUANTUM-DOT LIGHT EMITTING DEVICE AND METHOD OF FABRICATING THE SAME"

Korean Patent No. 10-0642431 entitled "QUANTUM-DOT LIGHT EMITTING DIODE INCLUDING INORGANIC ELECTRON TRANSPORT LAYER"

Korean Patent Application Publication No. 10-2016-0071924 entitled "ORGANIC LIGHT EMITTING DISPLAY AND METHOD OF FABRICATING THE SAME"

DISCLOSURE

Technical Problem

Therefore, the present invention has been made in view of the above problems, and it is one object of the present invention to provide a quantum-dot light emitting device including a charge generation junction that is constituted of a p-type semiconductor layer and an n-type semiconductor layer, so that a charge is generated at an interface between the p-type semiconductor layer and the n-type semiconductor layer to stabilize charge generation and injection.

It is another object of the present invention to form a charge generation junction constituted of a p-type semiconductor layer and an n-type semiconductor layer by a solution process, so that a process time is shortened and problems in the work function of an upper or lower electrode of a quantum-dot light emitting device are addressed.

It is yet another object of the present invention to provide a tandem-type quantum-dot light emitting device having high performance at low cost.

Technical Solution

In accordance with an aspect of the present invention, the above and other objects can be accomplished by the provision of a quantum-dot light emitting device including a negative electrode; a first charge generation junction layer formed on the negative electrode; a quantum-dot light emitting layer formed on the first charge generation junction layer; a hole transport layer formed on the quantum-dot light emitting layer; a second charge generation junction layer formed on the hole transport layer; and a positive electrode formed on the second charge generation junction layer, wherein the first and second charge generation junction layers have a layer-by-layer structure wherein a p-type semiconductor layer and an n-type semiconductor layer are sequentially formed.

The first and second charge generation junction layers may be formed using a solution process.

The p-type semiconductor layer may include at least one of PEDOT:PSS and PEDOT:PSS mixed with an additive.

The additive may include at least one of graphene oxide (GO), carbon nanotubes (CNT), vanadium oxide ($V_2O_5$), tungsten oxide ($WO_x$), and polyoxyethylene tridecyl ether (PTE).

The additive may be included in an amount of 1% by volume to 50% by volume in the PEDOT:PSS.

The p-type semiconductor layer may include at least one of nickel oxide (NiO) and nickel oxide (NiO) doped with the first dopant.

The first dopant may include at least one of Sn (tin), copper (Cu), lithium (Li), and zinc (Zn).

The first dopant may be included in an amount of 0.1 atomic % to 50 atomic % in the nickel oxide (NiO).

The p-type semiconductor layer may include at least one of copper oxide (CuO) and copper oxide (CuO) doped with the second dopant.

The second dopant may include at least one of nickel (Ni), copper (Cu), lithium (Li), and zinc (Zn).

The second dopant may be included in an amount of 0.1 atomic % to 50 atomic % in the copper oxide (CuO).

The n-type semiconductor layer may include at least one of zinc oxide (ZnO) or zinc oxide (ZnO) doped with the third dopant.

The third dopant may include at least one of cesium (Cs), lithium (Li), aluminium (Al), magnesium (Mg), indium (In), and gallium (Ga).

The third dopant may be included in an amount of 0.1 atomic % to 50 atomic % in the zinc oxide (ZnO).

In accordance with another aspect of the present invention, there is provided a quantum-dot light emitting device including a positive electrode; a first charge generation junction layer formed on the positive electrode; a first quantum-dot light emitting layer formed on the first charge generation junction layer; a first hole transport layer formed on the first quantum-dot light emitting layer; a second charge generation junction layer formed on the first hole transport layer; a second quantum-dot light emitting layer formed on the second charge generation junction layer; a second hole transport layer formed on the second quantum-dot light emitting layer; a third charge generation junction layer formed on the second hole transport layer; and a negative electrode formed on the third charge generation junction layer, wherein the first to third charge generation junction layers have a layer-by-layer structure wherein a p-type semiconductor layer and an n-type semiconductor layer are sequentially formed.

The first to third charge generation junction layers may be formed using a solution process.

In accordance with still another aspect of the present invention, there is provided a quantum-dot light emitting device including a positive electrode; a negative electrode; a quantum-dot light emitting layer; a hole transport layer; and two or more charge generation junction layers, wherein the charge generation junction layers have a layer-by-layer structure wherein a p-type semiconductor layer and an n-type semiconductor layer are sequentially formed.

The charge generation junction layers may be formed using a solution process.

In accordance with yet another aspect of the present invention, there is provided a method of fabricating a quantum-dot light emitting device, the method including forming a negative electrode; forming a first charge generation junction layer on the negative electrode; forming a quantum-dot light emitting layer on the first charge generation junction layer; forming a hole transport layer on the quantum-dot light emitting layer; forming a second charge generation junction layer on the hole transport layer; and forming a positive electrode on the second charge generation junction layer, wherein the first and second charge generation junction layers have a layer-by-layer structure wherein a p-type semiconductor layer and an n-type semiconductor layer are sequentially formed.

Advantageous Effects

A quantum-dot light emitting device according to an embodiment of the present invention includes a charge generation junction constituted of a p-type semiconductor layer and an n-type semiconductor layer, whereby a charge is generated at an interface between the p-type semiconductor layer and the n-type semiconductor layer, and thus, charge generation and injection can be stabilized.

The charge generation junction, constituted of the p-type semiconductor layer and the n-type semiconductor layer, of the quantum-dot light emitting device according to an embodiment of the present invention is formed by a solution process, whereby a process time can be shortened and problems in the work function of an upper or lower electrode of the quantum-dot light emitting device can be addressed.

The quantum-dot light emitting device according to an embodiment of the present invention is formed in a tandem structure, thereby having high performance at low cost.

BEST MODE

Figure 1:
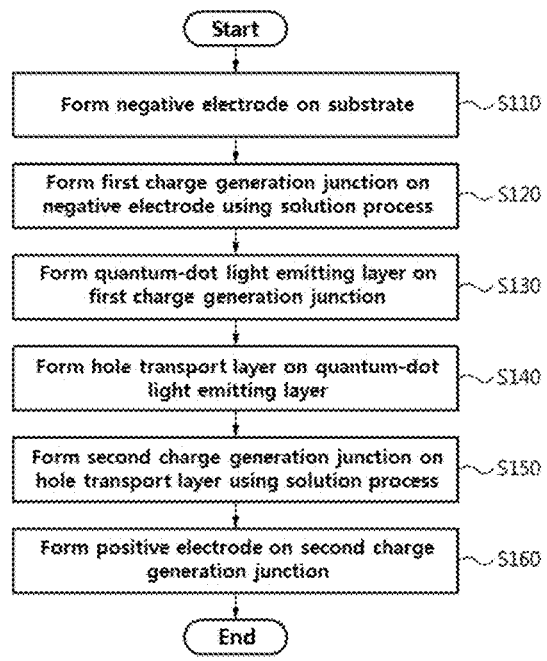
FIG. 1 is a flowchart illustrating a method of fabricating a quantum-dot light emitting device including a charge generation junction layer according to a first example of the present invention.

Embodiments of the invention will now be described more fully with reference to the accompanying drawings and contents disclosed in the drawings. However, the invention should not be construed as limited to the embodiments described herein.

The terms used in the present specification are used to explain embodiments and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the present specification and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

In addition, in the following description of the invention, a detailed description of known functions and configurations incorporated herein will be omitted when it may make the subject matter of the invention unclear. The terms used in the specification are defined in consideration of functions used in the invention, and can be changed according to the intent or conventionally used methods of clients, operators, and users. Accordingly, definitions of the terms should be understood on the basis of the entire description of the present specification.

Hereinafter, a method of fabricating a quantum-dot light emitting device according to a first embodiment is described with reference to FIG. 1.

FIG. 1 is a flowchart illustrating a method of fabricating a quantum-dot light emitting device including a charge generation junction layer according to the first example of the present invention.

Referring to FIG. 1, the method of fabricating a quantum-dot light emitting device according to the first example of the present invention includes a step of forming a negative electrode (S110), a step of forming a first charge generation junction layer on the negative electrode using a solution process (S120), a step of forming a quantum-dot light emitting layer on the first charge generation junction layer (S130), a step of forming a hole transport layer on the quantum-dot light emitting layer (S140), a step of forming a second charge generation junction layer on the hole transport layer using a solution process (S150), and a step of forming a positive electrode on the second charge generation junction layer (S160).

The first and second charge generation junction layers may be formed in a layer-by-layer structure wherein a p-type semiconductor layer and an n-type semiconductor layer are sequentially formed.

In addition, the first and second charge generation junction layers are formed using a solution process. Accordingly, it is possible to perform a large-area process, a process time may be shortened, and limitations on semiconductor characteristics of upper and lower electrodes (positive and negative electrodes) may be reduced.

Referring to FIG. 1, in S110 of the method of fabricating a quantum-dot light emitting device including a charge generation junction layer according to the example of the present invention, a negative electrode is formed on a substrate.

The substrate, which is a base substrate for forming a light emitting device, may be made of various materials such as such as silicon, glass, plastic, or metal foil without being specifically limited to substrate types used in the field.

For example, the plastic substrate may be made of polyethylene terephthalate (PET), polyethylene naphthelate (PEN), polypropylene (PP), polycarbonate (PC), polyimide (PI), triacetyl cellulose (TAC), and polyethersulfone (PES). In addition, the plastic substrate may be a flexible substrate including one of aluminum foil and stainless steel foil.

The negative electrode, which provides electrons to a device, may be made of a metal material, an ionized metal material, an alloy material, a metal ink material, which is present in a colloid state, in a predetermined liquid, and a transparent metal oxide.

Particular examples of the metal material include lithium (Li), magnesium (Mg), aluminium (Al), aluminium-lithium (Al—Li), calcium (Ca), magnesium-indium (Mg—In), magnesium-silver (Mg—Ag), platinum (Pt), gold (Au), nickel (Ni), copper (Cu), barium (Ba), silver (Ag), indium (In), ruthenium (Ru), lead (Pb), rhodium (Rh), iridium (Ir), osmium (Os), and cesium (Cs). In addition, the metal material may be made of carbon (C), a conductive polymer, or a combination thereof.

In addition, examples of the transparent metal oxide may include Indium Tin Oxide (ITO), Fluorine-doped Tin Oxide (FTO), Antimony Tin Oxide (ATO), and Aluminum-doped Zinc Oxide (AZO). Here, ITO is generally used as a material for forming a positive electrode, but may be used as a material for forming a negative electrode in an inverted solar cell to form a transparent negative electrode. To form the transparent metal oxide electrode, a sol-gel process, a spray pyrolysis process, a sputtering process, an Atomic Layer Deposition (ALD) process, or an e-beam evaporation process may be applied.

The negative electrode may be formed using a deposition method such as Chemical Vapor Deposition (CVD); or a coating method such as printing with a metal ink paste prepared by mixing metal flakes or particles with a binder. The negative electrode may be formed by any one method of forming an electrode without being limited to the methods.

Next, in S120, a first charge generation junction layer is formed on a negative electrode using a solution process.

The first charge generation junction layer may have a P-N junction structure wherein a p-type semiconductor layer and an n-type semiconductor layer are sequentially formed to form a layer-by-layer structure.

Accordingly, electrons may be tunneled from a Highest Occupied Molecular Orbital (HOMO) to a Lowest Unoccupied Molecular Orbital (LUMO) due to band bending. This tunneling process serves to supply a charge carrier (electrons or holes) to a quantum-dot light emitting device. Here, in the case of the first charge generation junction layer present on a negative electrode side, supplied charge carriers are electrons.

In addition, the first charge generation junction layer may exhibit similar effect to the case wherein a metal is contained between a negative electrode and a positive electrode in that the first charge generation junction layer supplies a charge carrier.

Injection of electrons into a negative electrode critically depends upon the work function of a negative electrode material. Washing a negative electrode or preparing a negative electrode surface before formation of the negative electrode may have a strong influence on the work function of the negative electrode, thereby also having a strong influence on an injection barrier.

The first charge generation junction layer according to the first example of the present invention may separate charge injection characteristics of the quantum-dot light emitting device from the work function of the negative electrode, thereby improving the charge injection characteristics of the quantum-dot light emitting device.

The first charge generation junction layer may be formed using a solution process. In particular, the first charge generation junction layer may be formed using one solution process selected from spin-coating, slit dye coating, ink-jet printing, spray coating, and dip coating.

The first charge generation junction layer may be particularly formed using spin-coating. The spin-coating is a method of dropping a predetermined amount of solution, and spinning a substrate at a high speed to coat the substrate by centrifugal force applied to the solution.

Since the first charge generation junction layer is formed by a solution process, it is possible to perform a large-area process, a process time may be shortened, and limitations on semiconductor characteristics of upper and lower electrodes (positive and negative electrodes) may be reduced.

As the p-type semiconductor layer used in the first charge generation junction layer, PEDOT:PSS or PEDOT:PSS mixed with additive may be used. The additive may include at least one of graphene oxide (GO), carbon nanotube (CNT), vanadium oxide ($V_2O_5$), tungsten oxide (WOx), and polyoxyethylene tridecyl ether (PTE).

The additive may be included in an amount of 1% by volume to 50% by volume in PEDOT:PSS.

When the content of the additive is less than 1% by volume, desired effects are not exhibited due to too small amount thereof. When the content of the additive is greater than 50% by volume, the characteristics of the p-type semiconductor layer are decreased, whereby charge generation is reduced.

In addition, the p-type semiconductor layer may include at least one of nickel oxide (NiO) and nickel oxide (NiO) doped with a first dopant. The first dopant may include at least one of tin (Sn), copper (Cu), lithium (Li) and zinc (Zn).

The first dopant may be included in an amount of 0.1 atomic % to 50 atomic % in the nickel oxide (NiO).

When the content of the first dopant is less than 0.1 atomic %, desired effects are not exhibited due to too small amount thereof. When the content of the first dopant is greater than 50 atomic %, the characteristics of the p-type semiconductor layer are decreased, whereby charge generation is reduced.

In addition, the p-type semiconductor layer may include at least one of copper oxide (CuO) or copper oxide (CuO) doped with a second dopant. The second dopant may include at least one of nickel (Ni), copper (Cu), lithium (Li), and zinc (Zn).

The second dopant may be included in an amount of 0.1 atomic % to 50 atomic % in the copper oxide (CuO).

When the content of the second dopant is less than 0.1 atomic %, desired effects are not exhibited due to too small amount thereof. When the content of the second dopant is greater than 50 atomic %, the characteristics of the p-type semiconductor layer are decreased, whereby charge generation is reduced.

The n-type semiconductor layer used in the first charge generation junction layer may include at least one of zinc oxide (ZnO) or zinc oxide (ZnO) doped with a third dopant. The third dopant may include at least one of cesium (Cs), lithium (Li), aluminium (Al), magnesium (Mg), indium (In), and gallium (Ga).

The third dopant may be included in an amount of 0.1 atomic % to 50 atomic % in the zinc oxide (ZnO).

When the content of the third dopant is less than 0.1 atomic %, desired effects are not exhibited due to too small amount thereof. When the content of the third dopant is greater than 50 atomic %, the characteristics of the p-type semiconductor layer are decreased, whereby charge generation is reduced.

Nickel oxide (NiO), copper oxide (CuO) and zinc oxide (ZnO) included in the first charge generation junction layer may be generated in at least one of sol-gel and nanoparticle forms.

The light emitting device has charge injection characteristics depending upon the work function of a metal. In the case of a light emitting device including a charge injection layer of a single p-type or n-type semiconductor layer, charge injection is not smooth due to an energy barrier caused by the work function of an upper/lower electrode (a positive electrode or a negative electrode).

However, when the first charge generation junction layer according to an embodiment of the present invention is formed, a charge is generated at an interface between a p-type semiconductor layer and an n-type semiconductor layer, whereby there is no influence on a light emitting device even if metals having different work functions are used as electrodes. That is, since a charge is generated at an interface between a p-type semiconductor layer and an n-type semiconductor layer due to the first charge generation junction layer according to an embodiment of the present invention, generation and injection of charge may be stabilized.

Next, in S130, a quantum-dot light emitting layer is formed on the first charge generation junction layer.

With regard to the quantum-dot light emitting layer, holes injected from a positive electrode meet electrons injected from a negative electrode to form excitons. The formed excitons may be used as a light emitting layer that generates light having a specific wavelength.

The quantum-dot light emitting layer may be made of at least one semiconductor material selected from the group consisting of a group II-VI semiconductor compound, a group III-V semiconductor compound, a group IV-VI semiconductor compound, a group IV element or compound, and a combination thereof.

The group II-VI semiconductor compound may be made of at least one material selected from the group consisting of a binary compound selected from the group consisting of CdSe, CdS, ZnS, CdTe, ZnSe, ZnTe, ZnO, HgS, HgSe, HgTe, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V semiconductor compound may be made of at least one material selected from the group consisting of a binary compound selected from the group consisting of GaN, GaP, GaAs, GaSb, AN, AlP, AlAs, AlSb, InN, InP, InAs, InSb and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI semiconductor compound may be made of at least one material selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof.

The group IV element or compound may be made of at least one material selected from the group consisting of an element or compound selected from the group consisting of Si, Ge, and a mixture thereof; and a binary compound selected from the group consisting of SiC, SiGe, and a mixture thereof.

Preferably, CdSe/CdS/ZnS may be used as the quantum-dot light emitting layer.

According to an embodiment, any one of an organic compound layer, an oxide layer, a nitride layer, a semiconductor layer, an organic compound layer, an inorganic compound layer, a phosphor layer, and a dye layer may be included as the light emitting layer.

The quantum-dot light emitting layer may be formed using vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, or zone casting.

Next, in S140, a hole transport layer is formed on the quantum-dot light emitting layer.

The hole transport layer, which serves to transport holes to the quantum-dot light emitting layer, may be formed by a vacuum deposition process or a solution process using an organic or inorganic material.

The hole transport layer allows holes to be efficiently transferred to the quantum-dot light emitting layer and the densities of holes and electrons to be balanced in the quantum-dot light emitting layer, thereby increasing light emission efficiency.

In addition, at a negative electrode, electrons injected into the quantum-dot light emitting layer are trapped in the quantum-dot light emitting layer due to an energy barrier present at an interface between the hole transport layer and the quantum-dot light emitting layer, whereby the probability of recombination of electrons and holes increases. Accordingly, light emission efficiency may increase.

In addition, the hole transport layer is formed between the quantum-dot light emitting layer and the second charge generation junction layer, thereby further increasing the effect of the second charge generation junction layer.

The hole transport layer, which serves to transport holes, may be formed of PEDOT:PSS. The PEDOT:PSS may be mixed with an additive such as tungsten oxide ($WO_3$), graphene oxide (GO), carbon nanotubes (CNT), molybdenum oxide (MoOx), vanadium oxide ($V_2O_5$), or nickel oxide (NiOx), without being limited thereto. The PEDOT:PSS may be formed of various organic or inorganic materials.

Next, in S150, a second charge generation junction layer is formed on the hole transport layer using a solution process.

The second charge generation junction layer may have a P-N junction structure wherein a p-type semiconductor layer and an n-type semiconductor layer are sequentially formed in a layer-by-layer structure.

Accordingly, electrons may be tunneled from a Highest Occupied Molecular Orbital (HOMO) to a Lowest Unoccupied Molecular Orbital (LUMO) due to band bending. This tunneling process serves a charge carrier (electrons or holes) to a quantum-dot light emitting device. Here, in the case of the second charge generation layer present on a positive electrode side, supplied charge carriers are holes.

In addition, the second charge generation junction layer may exhibit similar effect to the case wherein a metal is contained between a negative electrode and a positive electrode in that the first charge generation junction layer supplies a charge carrier.

Injection of electrons into a positive electrode critically depends upon the work function of a positive electrode material. Washing a positive electrode or preparing a positive electrode surface before formation of the positive electrode may have a strong influence on the work function of the positive electrode, thereby affecting on a strong influence also on an injection barrier.

The second first charge generation junction layer according to the first example of the present invention may separate charge injection characteristics of the quantum-dot light emitting device from the work function of the positive electrode, thereby improving the charge injection characteristics of the quantum-dot light emitting device.

In addition, the second charge generation junction layer includes an n-type semiconductor layer formed in a positive electrode direction and a p-type semiconductor layer formed on a quantum-dot light emitting layer side, thereby allowing transport switch between holes and electrons for charge transport.

The second charge generation junction layer may be formed using a solution process. In particular, the second charge generation junction layer may be formed using one solution process selected from spin-coating, slit dye coating, ink-jet printing, spray coating, and dip coating.

The light emitting device has charge injection characteristics depending upon the work function of a metal. In the case of a light emitting device including a charge injection layer of a single p-type or n-type semiconductor layer, charge injection is not smooth due to an energy barrier caused by the work function of an upper/lower electrode (a positive electrode or a negative electrode).

However, when the second charge generation junction layer according to an embodiment of the present invention is formed, a charge is generated at an interface between a p-type semiconductor layer and an n-type semiconductor layer, whereby there is no influence on a light emitting device even if metals having different work functions are used as electrodes. That is, since a charge is generated at an interface between a p-type semiconductor layer and an n-type semiconductor layer due to the second charge generation junction layer according to an embodiment of the present invention, generation and injection of charge may be stabilized.

Finally, in S160, a positive electrode is formed on the second charge generation junction layer.

The positive electrode, which serves to provide holes to a device, may be formed using a transparent electrode, a reflective electrode, a metal paste, or a metal ink material, which is present in a colloid state, in a predetermined liquid, through a solution process such as screen printing.

The transparent electrode material may be at least one of transparent and highly conductive indium tin oxide (ITO), indium zinc oxide (IZO), tin oxide ($SnO_2$), zinc oxide (ZnO), multilayer metal oxide/metal/metal oxide, graphene, and carbon nanotubes.

The reflective electrode material may be at least one of magnesium (Mg), aluminium (Al), silver (Ag), Ag/ITO, Ag/IZO, aluminium-lithium (Al—Li), calcium (Ca), magnesium-indium (Mg—In), and magnesium-silver (Mg—Ag).

The metal paste may be one of silver (Ag) paste, aluminium (Al) paste, gold (Au) paste, and copper (Cu) paste materials or an alloy thereof.

The metal ink material may be at least one of silver (Ag) ink, aluminium (Al) ink, gold (Au) ink, calcium (Ca) ink, magnesium (Mg) ink, lithium (Li) ink, and cesium (Cs) ink. The metal material included in the metal ink material may be ionized in a solution.

The positive electrode may be formed on a substrate using a well-known deposition method such as Chemical Vapor Deposition (CVD); or a well-known coating method such as printing with a metal ink paste prepared by mixing metal flakes or particles with a binder. The positive electrode may be formed by any one method of forming an electrode without being limited to the methods.

Figure 2:
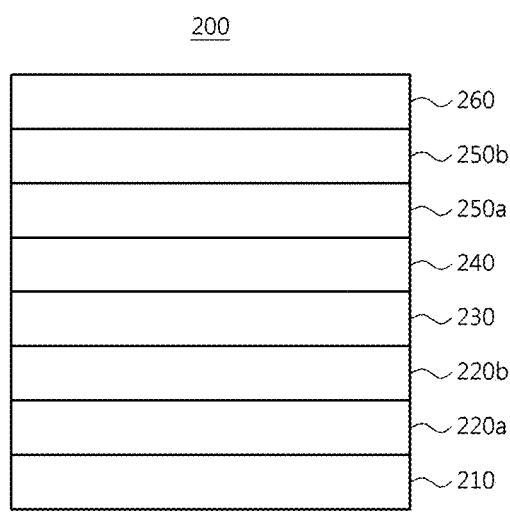
FIG. 2 illustrates a sectional view of a structure of a quantum-dot light emitting device including a charge generation junction layer according to a first example of the present invention.

FIG. 2 illustrates a sectional view of a structure of a quantum-dot light emitting device including a charge generation junction layer according to a first example of the present invention.

The quantum-dot light emitting device including a charge generation junction layer according to an embodiment of the present invention may include two or more charge generation junction layers. FIG. 2 illustrates a quantum-dot light emitting device including two charge generation junction layers 220a, 220b, 250a, and 250b.

A quantum-dot light emitting device 200 including a charge generation junction layer according to the first example of the present invention includes a negative electrode 210; first charge generation junction layers 220a and 220b formed on the negative electrode 210; and a quantum-dot light emitting layer 230 formed on the first charge generation junction layers 220a and 220b.

A hole transport layer 240 is formed on the quantum-dot light emitting layer 230, second charge generation junction layers 250a and 250b are formed on the hole transport layer 240, and a positive electrode 260 is formed on the second charge generation junction layers 250a and 250b.

The first charge generation junction layers 220a and 220b include a first p-type semiconductor layer 220a and a first n-type semiconductor layer 220b, and the second charge generation junction layers 250a and 250b include a second p-type semiconductor layer 250a and a second n-type semiconductor layer 250b. The first charge generation junction layers 220a and 220b and the second charge generation junction layers 250a and 250b are formed in a layer-by-layer structure wherein layers are sequentially formed.

The constructions of the quantum-dot light emitting device 200 including a charge generation junction layer according to the first example of the present invention are the same as those described in FIG. 1. Accordingly, detailed descriptions thereof are omitted.

Hereinafter, a tandem quantum-dot light emitting device 300 including a charge generation junction layer according to a second example of the present invention is described in detail with reference to FIG. 3.

Figure 3:
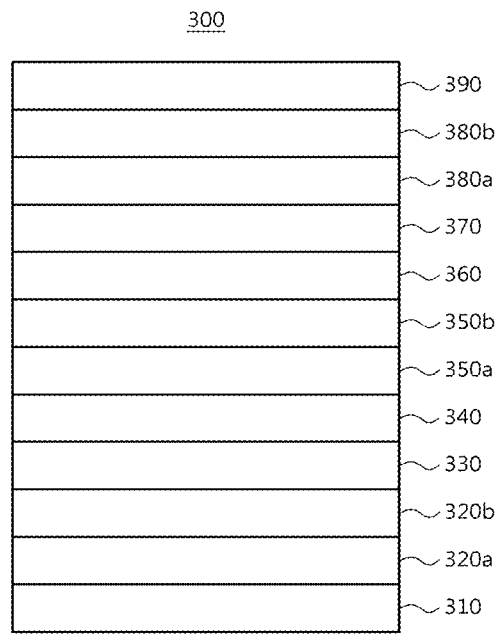
FIG. 3 illustrates a sectional view of a tandem quantum-dot light emitting device including a charge generation junction layer according to a second example of the present invention.

FIG. 3 illustrates a sectional view of a quantum-dot light emitting device including a charge generation junction layer according to a second example of the present invention.

The quantum-dot light emitting device including a charge generation junction layer according to an embodiment of the present invention may include two or more charge generation junction layers. FIG. 3 illustrates a quantum-dot light emitting device including three charge generation junction layers 320a, 320b, 350a, 350b, 380a, and 380b.

Referring to FIG. 3, a quantum-dot light emitting device 300 including a charge generation junction layer according to the second example of the present invention includes a positive electrode 310, first charge generation junction layers 320a and 320b formed on the positive electrode 310, a first quantum-dot light emitting layer 330 formed on the first charge generation junction layers 320a and 320b, a first hole transport layer 340 formed on the first quantum-dot light emitting layer 330, and second charge generation junction layers 350a and 350b formed on the first hole transport layer 340.

A second quantum-dot light emitting layer 360 is formed on the second charge generation junction layers 350a and 350b, a second hole transport layer 370 is formed on the second quantum-dot light emitting layer 360, third charge generation junction layers 380a and 380b are formed on the second hole transport layer 370, and a negative electrode 390 is formed on the third charge generation junction layers 380a and 380b.

The first charge generation junction layers 320a and 320b to the third charge generation junction layers 380a and 380b include first to third p-type semiconductor layers 320a, 350a, and 380a and first to third n-type semiconductor layers 320b, 350b, and 380b which are sequentially formed in a layer-by-layer structure.

The first charge generation junction layers 320a and 320b to the third charge generation junction layers 380a and 380b may be formed using a solution process.

Constructions of the quantum-dot light emitting device 300 including a charge generation junction layer according to the second example of the present invention are the same as those of the first example of the present invention, except that the quantum-dot light emitting device 300 includes two quantum-dot light emitting layers and three charge generation junction layers. Accordingly, detailed descriptions of constructions of the quantum-dot light emitting device 300 are omitted.

The quantum-dot light emitting device 300 including a charge generation junction layer according to the second example of the present invention is formed in a tandem structure including two quantum-dot light emitting layers, and thus may be fabricated to have high performance at low cost.

Hereinafter, a quantum-dot light emitting device 400 including a charge generation junction layer according to a third example of the present invention is described with reference to FIG. 4.

Figure 4:
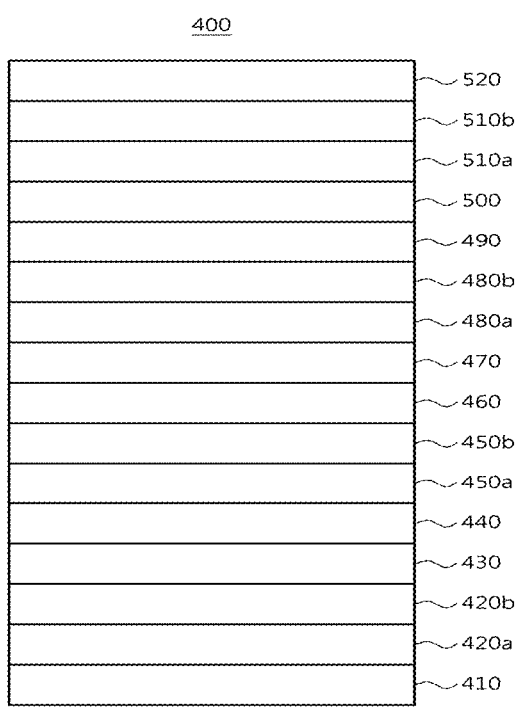
FIG. 4 illustrates a sectional view of a tandem quantum-dot light emitting device including a charge generation junction layer according to a third example of the present invention.

FIG. 4 illustrates a sectional view of a quantum-dot light emitting device including a charge generation junction layer according to a third example of the present invention.

The quantum-dot light emitting device including a charge generation junction layer according to an embodiment of the present invention may include two or more charge generation junction layers. FIG. 4 illustrates a quantum-dot light emitting device including four charge generation junction layers 420a, 420b, 450a, 450b, 480a, and 480b.

Referring to FIG. 4, the quantum-dot light emitting device 400 including a charge generation junction layer according to the third example of the present invention includes a positive electrode 410, first charge generation junction layers 420a and 420b formed on the positive electrode 410, a first quantum-dot light emitting layer 430 formed on the first charge generation junction layers 420a and 420b, a first hole transport layer 440 formed on the first quantum-dot light emitting layer 430, and second charge generation junction layers 450a and 450b formed on the first hole transport layer 440.

A second quantum-dot light emitting layer 460 is formed on the second charge generation junction layers 450a and 450b, a second hole transport layer 470 is formed on the second quantum-dot light emitting layer 460, and third charge generation junction layers 480a and 480b are formed on the second hole transport layer 470.

A third quantum-dot light emitting layer 490 is formed on the third charge generation junction layers 480a and 480b, a third hole transport layer 500 is formed on the third quantum-dot light emitting layer 490, fourth charge generation junction layers 510a and 510b are formed on the third hole transport layer 500, and a negative electrode 520 is formed on the fourth charge generation junction layers 510a and 510b.

The first charge generation junction layers 420a and 420b to the fourth charge generation junction layers 510a and 510b include first to fourth p-type semiconductor layers 240a, 450a, 480a, and 510a and first to fourth n-type semiconductor layers 240b, 450b, 480b, and 510b which are sequentially formed in a layer-by-layer structure.

The first charge generation junction layers 420a and 420b to the fourth charge generation junction layers 510a and 510b may be formed using a solution process.

Constructions of the quantum-dot light emitting device 400 including a charge generation junction layer according to the third example of the present invention are the same as those of the first example of the present invention, except that the quantum-dot light emitting device 400 includes three quantum-dot light emitting layers and four charge generation junction layers. Accordingly, detailed descriptions of constructions of the quantum-dot light emitting device 400 are omitted.

The quantum-dot light emitting device 400 including a charge generation junction layer according to the third example of the present invention is formed in a tandem structure including three quantum-dot light emitting layers, and thus may be fabricated to have high performance at low cost.

Comparative Example

A negative electrode was formed on a glass substrate. To inject electrons into the formed negative electrode, 2 at % Li-doped ZnO was formed to a thickness of 50 nm using spin-coating. A light emitting layer having a quantum dot structure was formed to a thickness of 30 nm on the electron-injected layer using spin coating. A hole transport layer was formed to a thickness of 20 nm on the quantum-dot light emitting layer using spin coating. PEDOT:PSS was spin-coated to a thickness of 20 nm on the hole transport layer so as to inject holes. The hole-injected layer was vacuum-deposited with aluminium (Al) to form a positive electrode.

Fabrication Example

Ethanol was used as a solvent for LZO prepared by doping zinc oxide with 2 atomic % Li, and water was used as a solvent for PEDOT:PSS. The prepared solution was printed on a negative electrode, which was made of aluminium, by a solution process in a nitrogen or air atmosphere. Accordingly, a charge generation junction layer having a layer-by-layer wherein 2 atomic % LZO and PEDOT:PSS were sequentially formed was used.

Next, a quantum-dot light emitting layer, a hole transport layer, a charge generation junction layer, and a positive electrode were sequentially formed on the charge generation junction layer.

A quantum-dot material having a CdSe/CdS/ZnS structure (core/shell/shell type) was used as a quantum-dot light emitting layer, 4,4,4-tris (N-carbazolyl)triphenylamine (TCTA) and 4,4'-bis[N-(naphthyl)-N-phenylamino]biphenyl (NPB) were used as a hole transport layer, and aluminium was used as a positive electrode.

FIGS. 5A to 5D are graphs illustrating the characteristics of a quantum-dot light emitting device according to a comparative example.

Figure 5A:
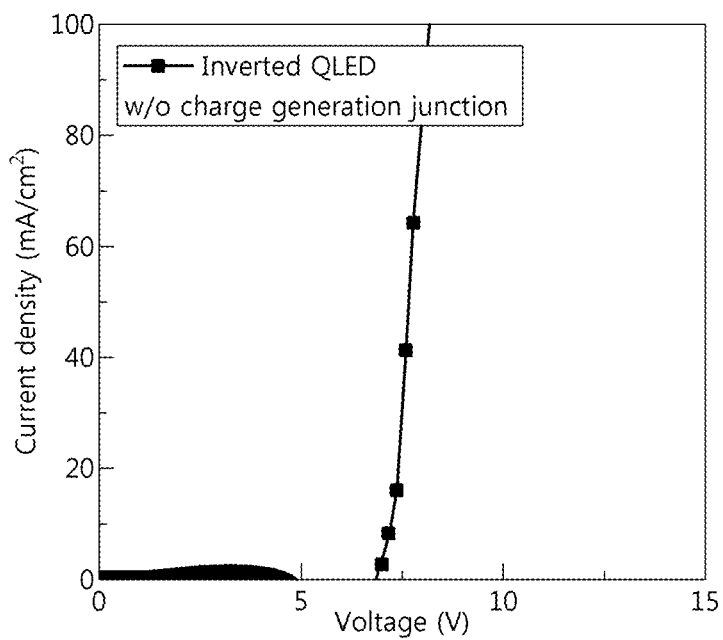
FIGS. 5A to 5D are graphs illustrating the characteristics of a quantum-dot light emitting device according to a comparative example.
Figure 5B:
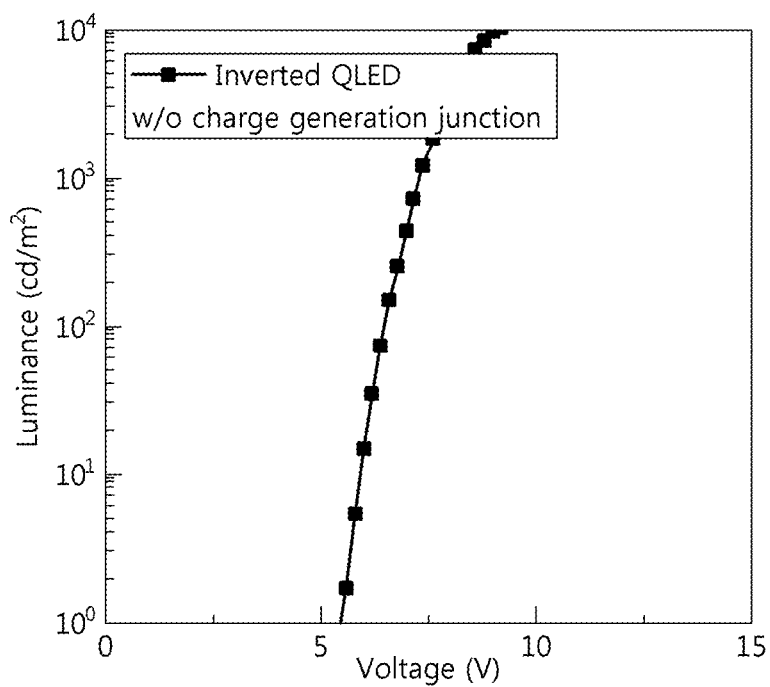
Figure 5C:
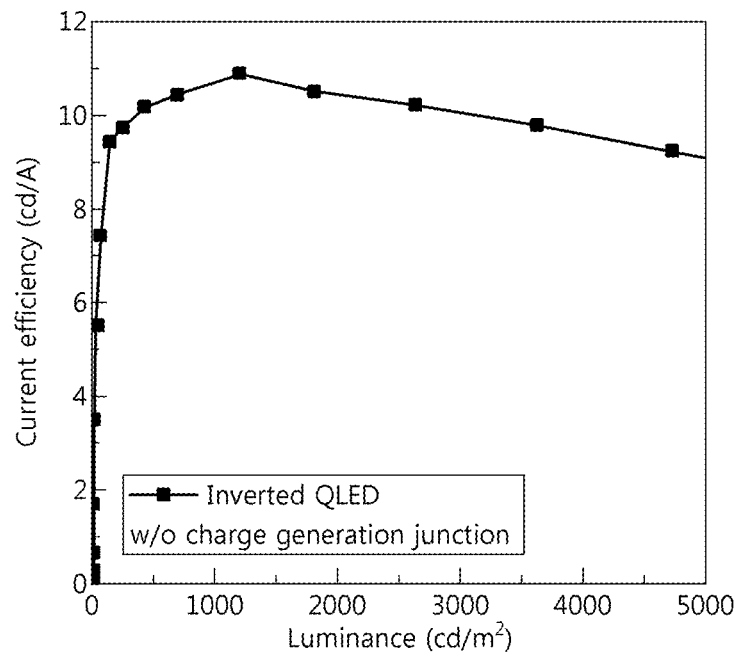
Figure 5D:
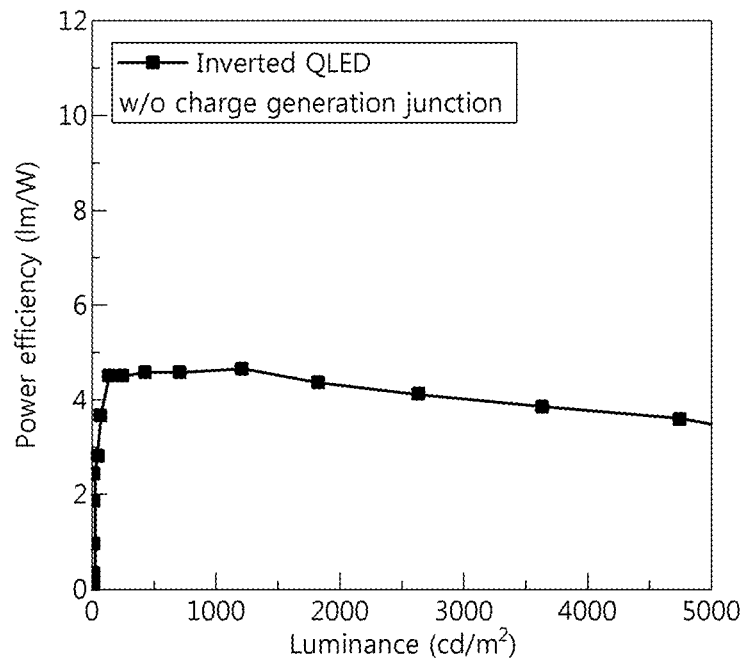

FIG. 5A is a graph illustrating a current density dependent upon voltage, FIG. 5B is a graph illustrating luminance dependent upon voltage, FIG. 5C is a graph illustrating a current density dependent upon luminance, and FIG. 5D is a graph illustrating power efficiency dependent upon luminance.

In the quantum-dot light emitting device according to the comparative example, $V_T$ (voltage when light having an intensity of 1 cd/m$^2$ is emitted) and $V_D$ (voltage when light having an intensity of 1,000 cd/m$^2$ is emitted) were respectively measured as 5.5 V and 7.3 V. In addition, a maximum current efficiency and a power efficiency were respectively measured as 10.9 cd/A and 4.6 lm/W.

FIGS. 6A to 6D are graphs illustrating the characteristics of a quantum-dot light emitting device including a charge generation junction layer according to an embodiment of the present invention.

Figure 6A:
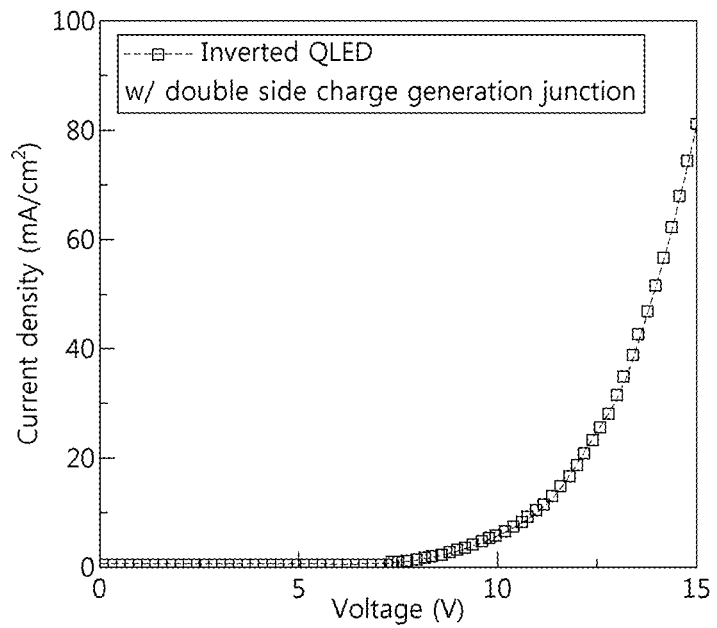
FIGS. 6A to 6D are graphs illustrating the characteristics of a quantum-dot light emitting device including a charge generation junction layer according to an embodiment of the present invention.
Figure 6B:
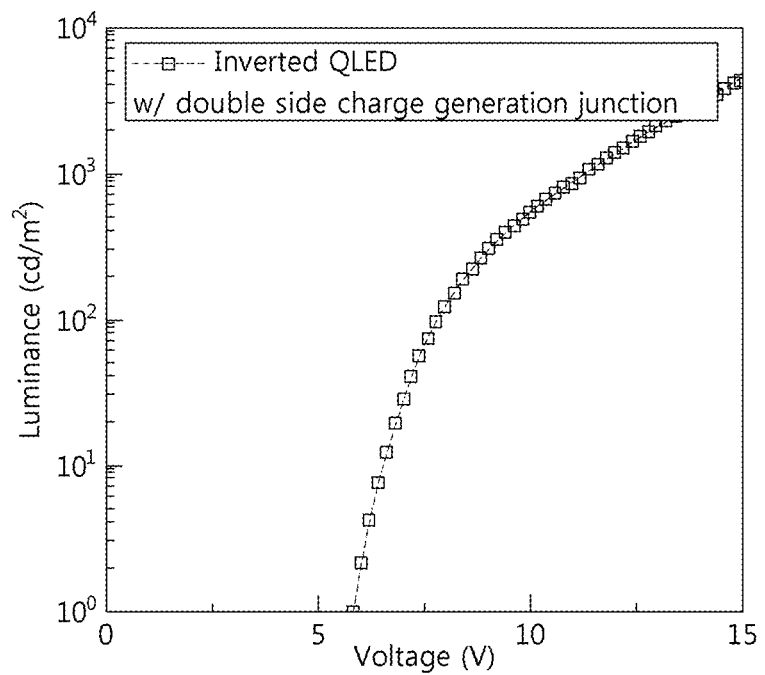
Figure 6C:
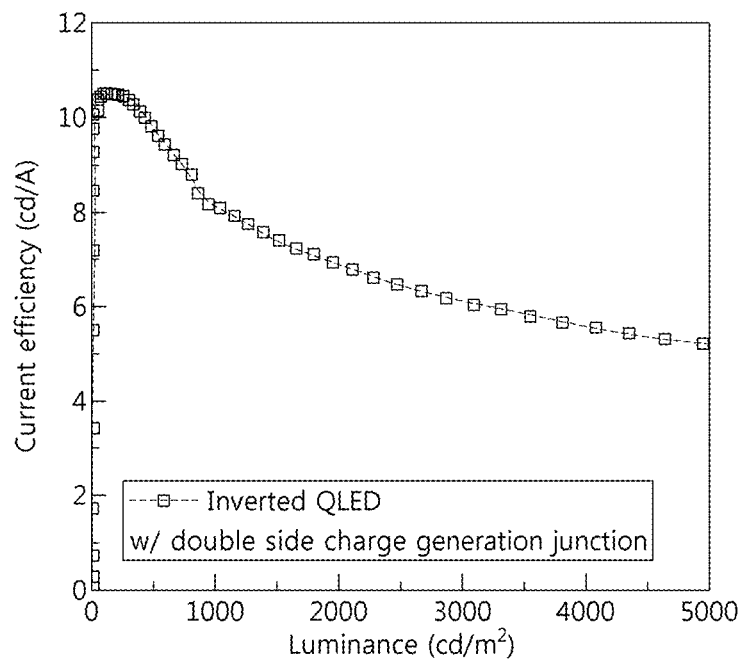
Figure 6D:
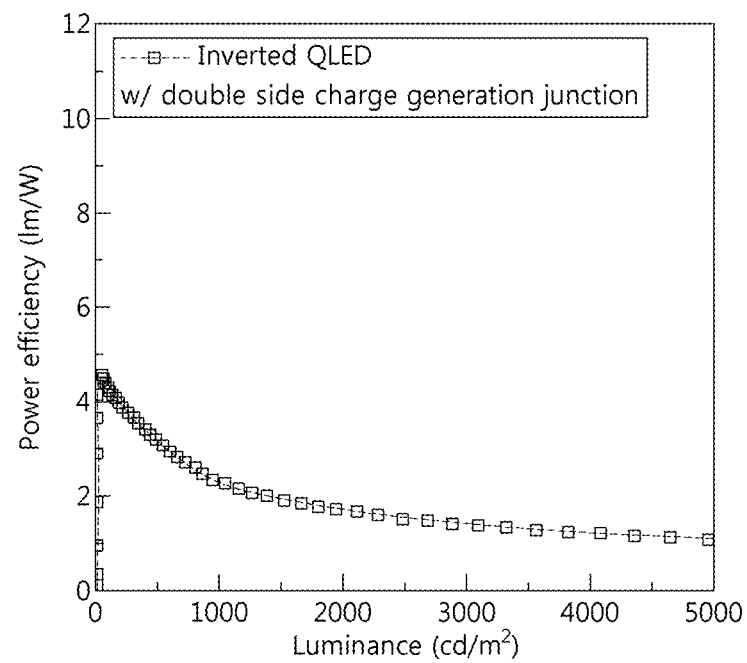

FIG. 6A is a graph illustrating a current density dependent upon voltage, FIG. 6B is a graph illustrating luminance dependent upon voltage, FIG. 6C is a graph illustrating a current density dependent upon luminance, and FIG. 6D is a graph illustrating power efficiency dependent upon luminance.

In Table 1, values representing the characteristics of the quantum-dot light emitting device including the charge generation junction layer according to an embodiment of the present invention are summarized.

TABLE 1

|  | $V_T$ (V) | $V_D$ (V) | $C/E_{max}$ (cd/A) | $P/E_{max}$ (lm/W) |
| --- | --- | --- | --- | --- |
| Conventional structure | 5.5 | 7.3 | 10.9 | 4.6 |
| Charge generation junction structure (on negative electrode and under positive electrode) | 5.8 | 11.3 | 10.5 | 4.5 |

Referring to Table 1, $V_T$ represents a voltage when light having an intensity of 1 cd/m² is emitted, $V_D$ represents when light having an intensity of 1,000 cd/m² is emitted, CE represents luminous efficacy at a current of 1 A, and PE represents luminous efficacy at a power of 1 W.

Referring to FIGS. 6A to 6D and Table 1, the quantum-dot light emitting device including the charge generation junction layer according to an embodiment of the present invention exhibits similar characteristics to the comparative example.

In the quantum-dot light emitting device including the charge generation junction layer according to an embodiment of the present invention, $V_T$ and $V_D$ were respectively measured as 5.8 V and 11.3 V. In addition, a maximum current efficiency and a power efficiency were respectively measured as 10.5 cd/A and 4.5 lm/W. From these results, it can be confirmed that the quantum-dot light emitting device according to an embodiment of the present invention exhibits very similar characteristics to the comparative example.

FIGS. 7A to 7D are graphs illustrating characteristics dependent upon heat treatment conditions for an n-type semiconductor layer included in a quantum-dot light emitting device including a charge generation junction layer according to an embodiment of the present invention.

Figure 7A:
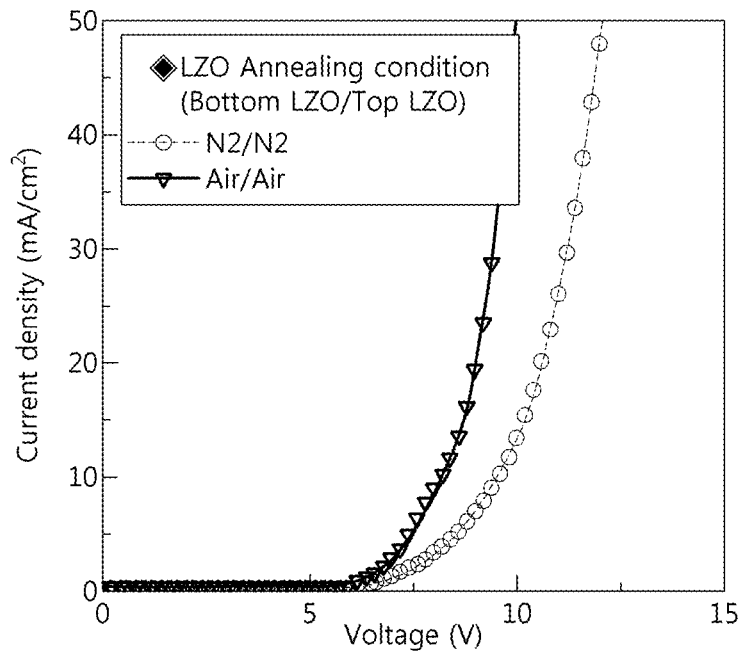
FIGS. 7A to 7D are graphs illustrating characteristics dependent upon heat treatment conditions for an n-type semiconductor layer included in a quantum-dot light emitting device including a charge generation junction layer according to an embodiment of the present invention.
Figure 7B:
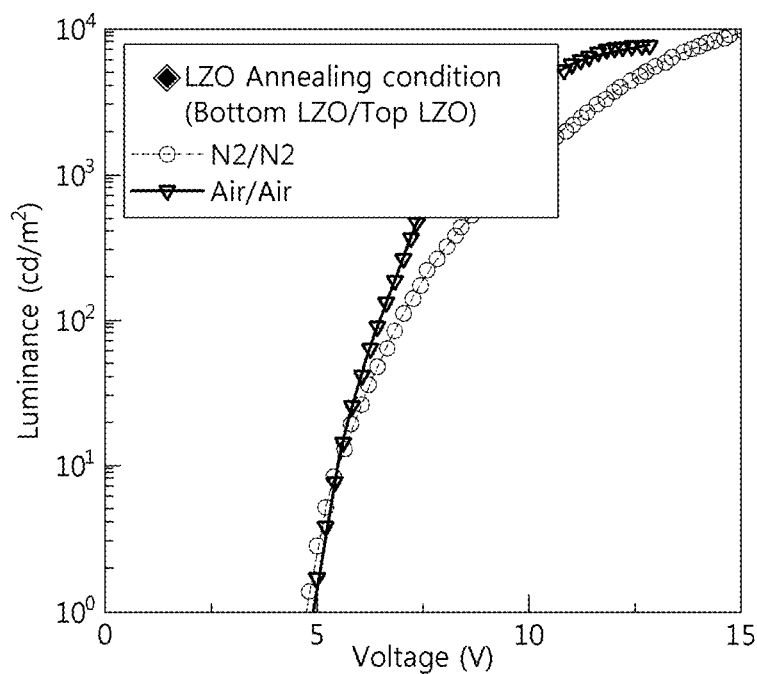
Figure 7C:
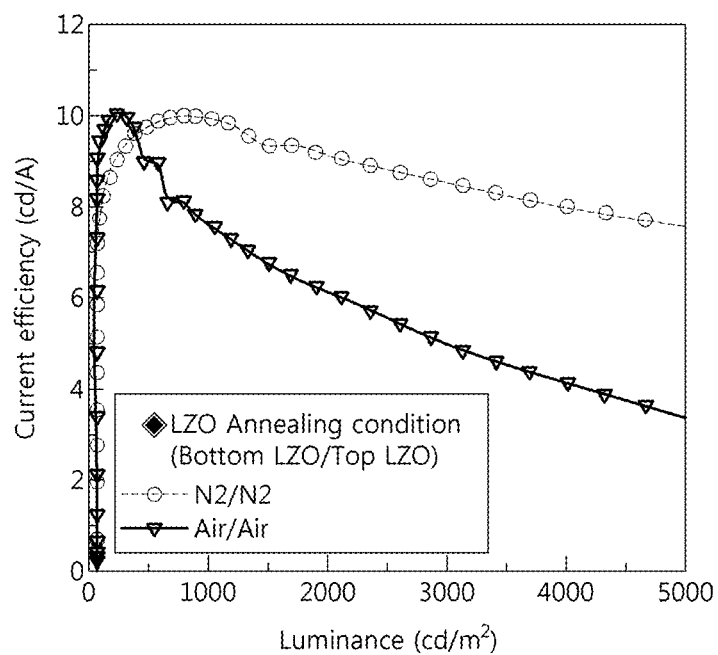
Figure 7D:
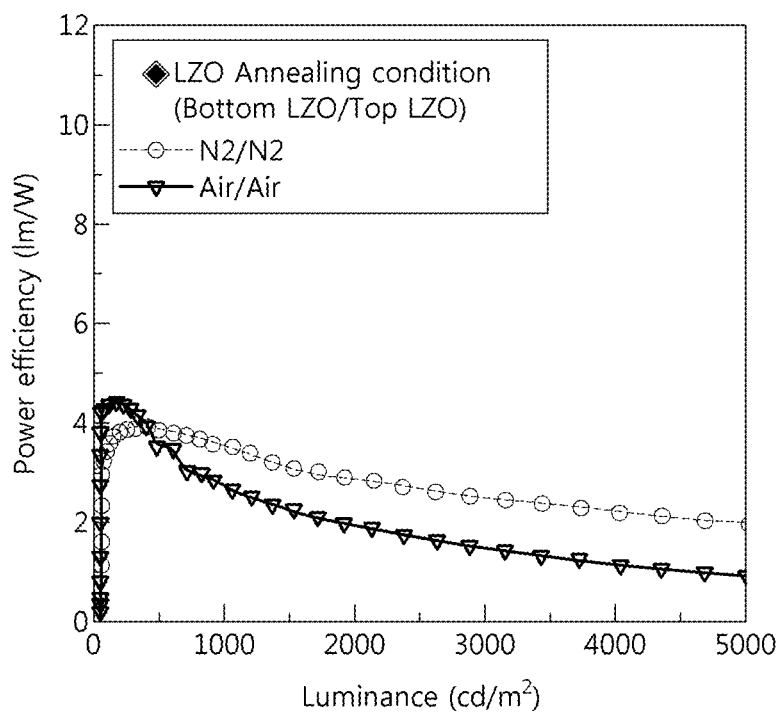

FIG. 7A is a graph illustrating a current density dependent upon voltage, FIG. 7B is a graph illustrating luminance dependent upon voltage, FIG. 7C is a graph illustrating a current density dependent upon luminance, and FIG. 7D is a graph illustrating power efficiency dependent upon luminance.

Referring to FIGS. 7A to 7D, it can be confirmed that the quantum-dot light emitting device including the charge generation junction layer according to an embodiment of the present invention can be driven without being limited by process conditions of an n-type semiconductor layer.

In addition, it can be confirmed that the charge generation junction layer can be formed regardless of heat treatment environments of the n-type semiconductor layer. To fabricate a quantum-dot light emitting device having high efficiency, a heat treatment environment for 2% Li-doped ZnO is preferably $N_2$.

FIGS. 8A to 8D are graphs illustrating the characteristics of a quantum-dot light emitting device according to an embodiment of the present invention when a charge generation junction layer of the quantum-dot light emitting device is formed under positive electrodes having different semiconductor characteristics.

Figure 8A:
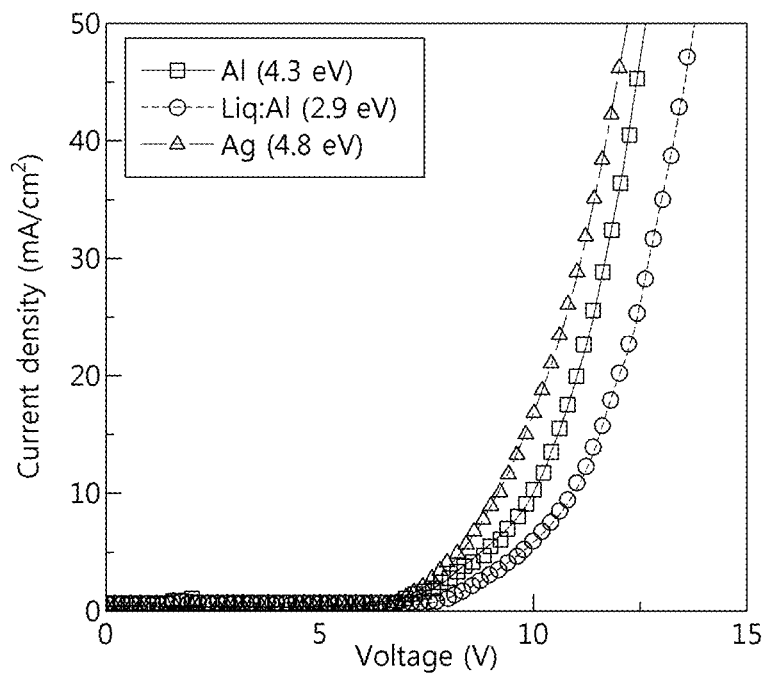
FIGS. 8A to 8D are graphs illustrating the characteristics of a quantum-dot light emitting device according to an embodiment of the present invention when a charge generation junction layer of the quantum-dot light emitting device is inserted under positive electrodes having different semiconductor characteristics.
Figure 8B:
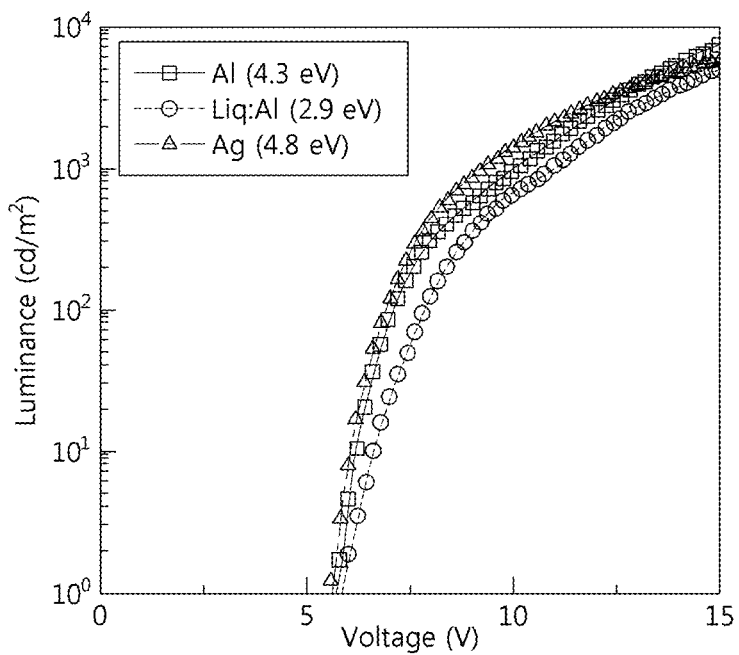
Figure 8C:
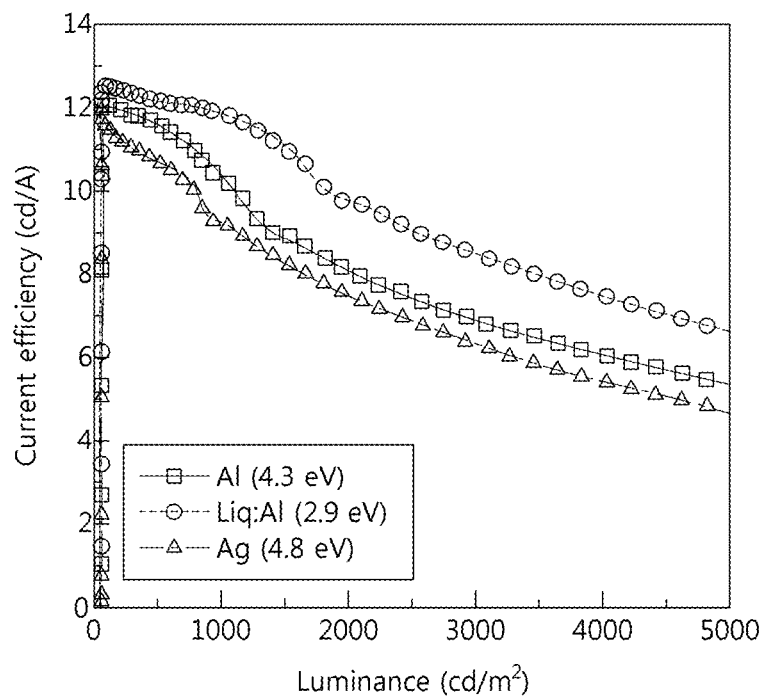
Figure 8D:
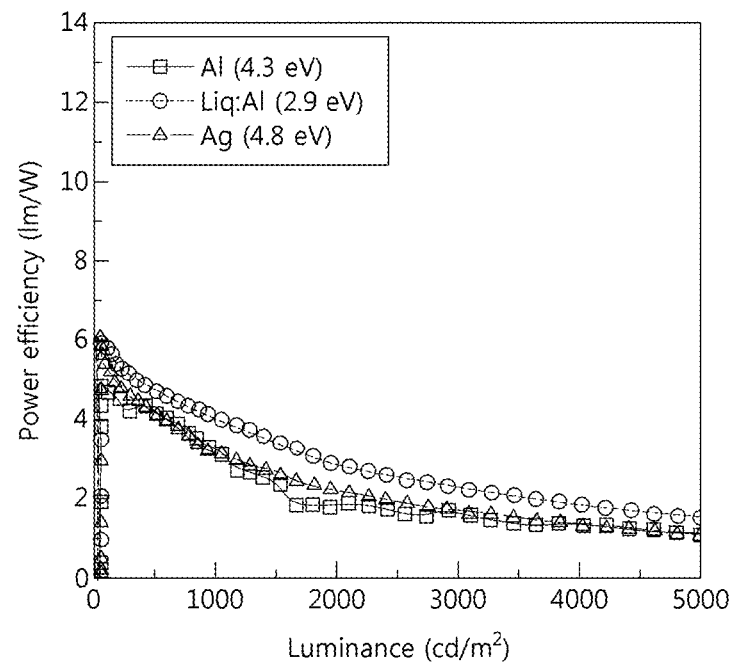

FIG. 8A is a graph illustrating a current density dependent upon voltage, FIG. 8B is a graph illustrating luminance dependent upon voltage, FIG. 8C is a graph illustrating a current density dependent upon luminance, and FIG. 8D is a graph illustrating power efficiency dependent upon luminance.

In Table 2, values representing the characteristics of quantum-dot light emitting devices including the charge generation junction layer according to an embodiment of the present invention are summarized. Here, the charge generation junction layer was formed under positive electrodes having different semiconductor characteristics.

TABLE 2

|  | $V_T$ (V) | $V_D$ (V) | $C/E_{max}$ (cd/A) | $P/E_{max}$ (lm/W) |
| --- | --- | --- | --- | --- |
| Al | 5.7 | 10.2 | 12.1 | 5.7 |
| Liq:Al | 5.8 | 10.9 | 12.5 | 5.9 |
| Ag | 5.6 | 9.3 | 11.9 | 6.1 |

Referring to FIGS. 8A to 8D and Table 2, it can be confirmed that the charge generation junction layer-based quantum-dot light emitting devices have similar characteristics, regardless of the work function of a positive electrode.

Al, LiF/Al and Ag were used as a positive electrode, and the work functions of the metals were 4.3 eV, 2.9 eV and 4.8 eV, respectively. It can be confirmed that the charge generation junction layer-based quantum-dot light emitting devices according to an embodiment of the present invention exhibit similar characteristics, regardless of the work functions of the electrodes (positive electrodes) formed on the charge generation junction layers. Accordingly, it can be confirmed that the charge generation junction layer has a characteristic of correcting the work function of an upper/lower electrode (a positive electrode or a negative electrode).

FIGS. 9A to 9D are graphs illustrating the characteristics of a quantum-dot light emitting device according to an embodiment of the present invention when a charge generation junction layer of the quantum-dot light emitting device is inserted between a positive electrode, a negative electrode, and two quantum-dot light emitting layers.

Figure 9A:
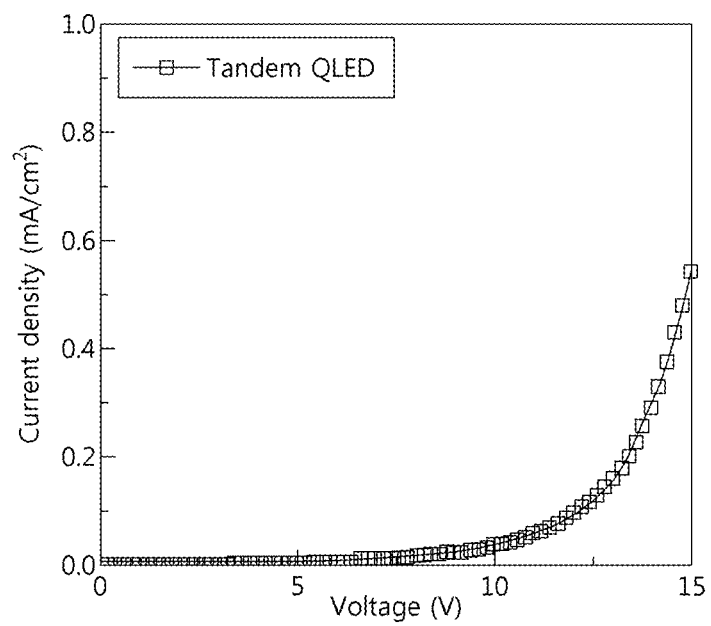
FIGS. 9A to 9D are graphs illustrating the characteristics of a quantum-dot light emitting device according to an embodiment of the present invention when a charge generation junction layer of the quantum-dot light emitting device is inserted between a positive electrode, a negative electrode, and two quantum-dot light emitting layers.
Figure 9B:
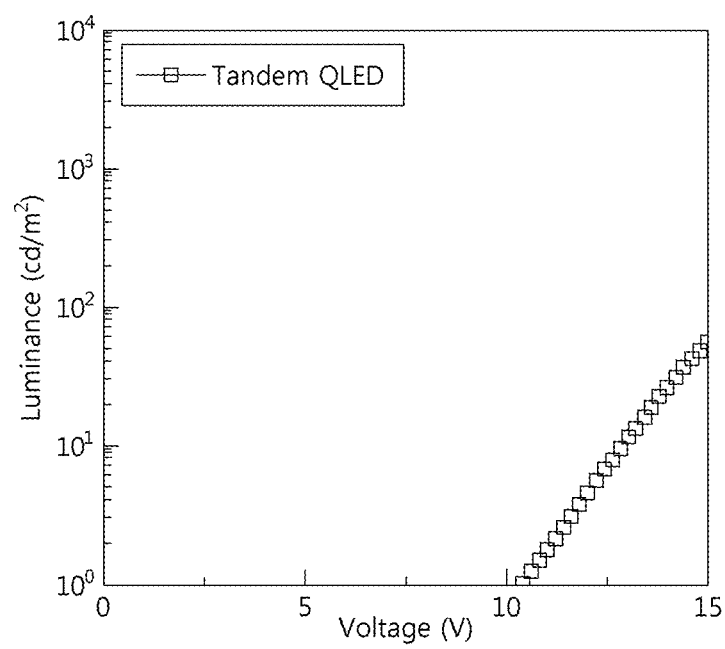
Figure 9C:
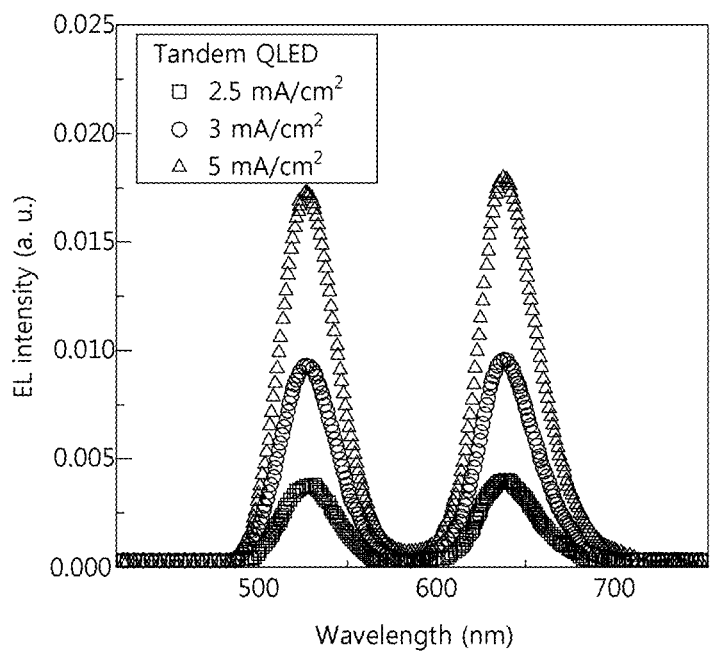
Figure 9D:
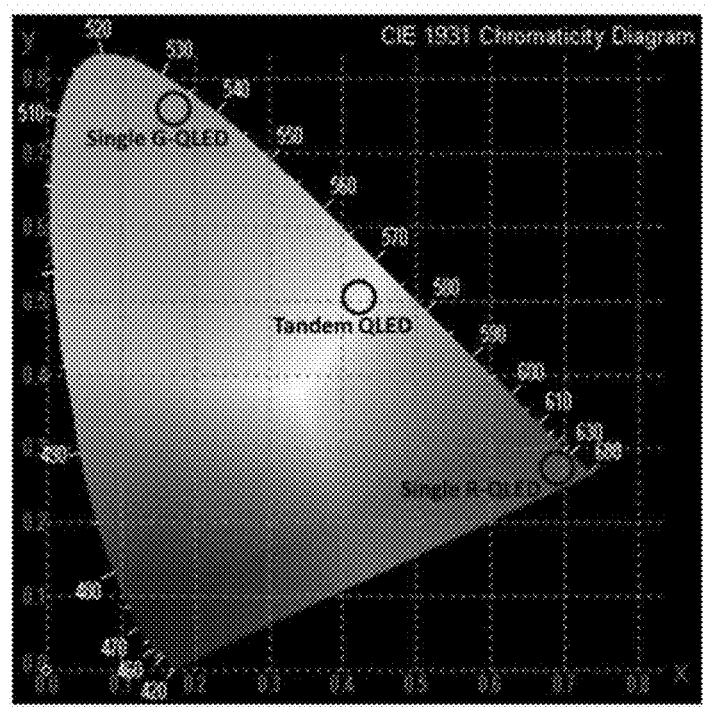

FIG. 9A is a graph illustrating a current density dependent upon voltage, FIG. 9B is a graph illustrating luminance dependent upon voltage, FIG. 9C is a graph illustrating EL intensity dependent upon wavelength, and FIG. 9D illustrates a CIE chromaticity diagram.

In Table 3, values representing the characteristics of the quantum-dot light emitting device including the charge generation junction layer according to an embodiment of the present invention, wherein the charge generation junction layer is inserted between a positive electrode, a negative electrode, and two quantum-dot light emitting layers are illustrated.

TABLE 3

|  | $V_T$ (V) | $V_D$ (V) | $C/E_{max}$ (cd/A) | $P/E_{max}$ (lm/W) |
| --- | --- | --- | --- | --- |
| Tandem QLED | 10.4 | — | 10.3 | 2.1 |

Referring to FIGS. 9A to 9D and Table 3, it can be confirmed that the characteristics of the charge generation junction layer-based tandem-type quantum-dot light emitting device are improved.

To fabricate the tandem-type quantum-dot light emitting device according to an embodiment of the present invention, first, green quantum dots were used as a quantum-dot light emitting layer. Second, red quantum dots were used as a quantum-dot light emitting layer. A solution process-based charge generation junction layer was inserted between the two quantum-dot light emitting layers.

If the quantum-dot light emitting device according to the comparative example is used to emit green light and red light, two quantum-dot light emitting devices should be separately fabricated. With regard to this case, a basic CIE chromaticity diagram is illustrated in FIG. 9D.

Referring to FIG. 9D, it can be confirmed that the tandem-type quantum-dot light emitting device according to an embodiment of the present invention emits yellow light in which green light and red light are simultaneously mixed.

That is, the aforementioned two quantum-dot light emitting layers of the tandem-type quantum-dot light emitting device according to an embodiment of the present invention simultaneously emit light, thus emitting yellow light.

Therefore, it can be confirmed that the light emission efficiency of the two quantum-dot light emitting layers of the quantum-dot light emitting device including the charge generation junction layer according to an embodiment of the present invention is improved due to the charge generation junction layer formed between the quantum-dot light emitting layers.

Although the present invention has been described through limited examples and figures, the present invention is not intended to be limited to the examples. Those skilled in the art will appreciate that various modifications, additions and substitutions are possible, without departing from the scope and spirit of the invention.

Therefore, it should be understood that there is no intent to limit the invention to the embodiments disclosed, rather, the invention is to cover all modifications, equivalents, and alternatives falling within the spirit and scope of the invention as defined by the claims.

DESCRIPTION OF SYMBOLS 200, 300, 400: Quantum-dot light emitting device
210, 390, 520: Negative electrode
220a, 320a, 420a: First p-type semiconductor layer
220b, 320b, 420b: First n-type semiconductor layer
230: Quantum-dot light emitting layer
240: Hole transport layer
330, 430: First quantum-dot light emitting layer
340, 440: First hole transport layer
250a, 350a, 450a: Second p-type semiconductor layer
250b, 350b, 450b: Second n-type semiconductor layer
260, 310, 420: Positive electrode
360, 460: Second quantum-dot light emitting layer
370, 470: Second hole transport layer
380a, 480a: Third p-type semiconductor layer
380b, 480b: Third n-type semiconductor layer
490: Third quantum-dot light emitting layer
500: Third hole transport layer
510a: Third p-type semiconductor layer
510b: Third n-type semiconductor layer

The invention claimed is:

1. A quantum-dot light emitting device formed in a structure including at least two of quantum-dot light emitting layers, comprising:
a positive electrode;
a first charge generation junction layer formed on the positive electrode;
a first quantum-dot light emitting layer formed on the first charge generation junction layer;
a first hole transport layer formed on the first quantum-dot light emitting layer;
a second charge generation junction layer formed on the first hole transport layer; and
a second quantum-dot light emitting layer formed on the second charge generation junction layer;
a second hole transport layer formed on the second quantum-dot light emitting layer;
a third charge generation junction layer formed on the second hole transport layer;
a negative electrode formed on the third charge generation junction layer,
wherein the first, second and third charge generation junction layers have a layer-by-layer structure wherein a p-type semiconductor layer and an n-type semiconductor layer are sequentially formed, and
wherein the first, second and third charge generation junction layers are formed using a solution process.

2. The quantum-dot light emitting device according to claim 1, wherein the p-type semiconductor layer comprises at least one of PEDOT:PSS and PEDOT:PSS mixed with an additive.

3. The quantum-dot light emitting device according to claim 2, wherein the additive comprises at least one of graphene oxide (GO), carbon nanotubes (CNT), vanadium oxide ($V_2O_5$), tungsten oxide ($WO_x$), and polyoxyethylene tridecyl ether (PTE).

4. The quantum-dot light emitting device according to claim 2, wherein the additive is comprised in an amount of 1% by volume to 50% by volume in the PEDOT:PSS.

5. The quantum-dot light emitting device according to claim 1, wherein the p-type semiconductor layer comprises at least one of nickel oxide (NiO) and nickel oxide (NiO) doped with the first dopant.

6. The quantum-dot light emitting device according to claim 5, wherein the first dopant comprises at least one of Sn (tin), copper (Cu), lithium (Li), and zinc (Zn).

7. The quantum-dot light emitting device according to claim 5, wherein the first dopant is comprised in an amount of 0.1 atomic % to 50 atomic % in the nickel oxide (NiO).

8. The quantum-dot light emitting device according to claim 1, wherein the p-type semiconductor layer comprises at least one of copper oxide (CuO) and copper oxide (CuO) doped with the second dopant.

9. The quantum-dot light emitting device according to claim 8, wherein the second dopant comprises at least one of nickel (Ni), copper (Cu), lithium (Li), and zinc (Zn).

10. The quantum-dot light emitting device according to claim 8, wherein the second dopant is comprised in an amount of 0.1 atomic % to 50 atomic % in the copper oxide (CuO).

11. The quantum-dot light emitting device according to claim 1, wherein the n-type semiconductor layer comprises at least one of zinc oxide (ZnO) or zinc oxide (ZnO) doped with the third dopant.

12. The quantum-dot light emitting device according to claim 11, wherein the third dopant comprises at least one of cesium (Cs), lithium (Li), aluminium (Al), magnesium (Mg), indium (In), and gallium (Ga).

13. The quantum-dot light emitting device according to claim 11, wherein the third dopant is comprised in an amount of 0.1 atomic % to 50 atomic % in the zinc oxide (ZnO).

14. A quantum-dot light emitting device, comprising:
a positive electrode;

a first charge generation junction layer formed on the positive electrode;
a light emitting unit formed on the first charge generation junction layer;
a negative electrode formed on the light emitting unit,
wherein the light emitting unit sequentially comprises a quantum-dot light emitting layer, a hole transport layer, and a second charge generation junction layer,
wherein the first and second charge generation junction layers have a layer-by-layer structure wherein a p-type semiconductor layer and an n-type semiconductor layer are sequentially formed,
wherein the quantum-dot light emitting device is formed in a structure including at least two of light emitting units, and
wherein the first and second charge generation junction layers are formed using a solution process.

* * * * *